United States Patent
Peczalski et al.

(10) Patent No.: US 9,823,329 B2
(45) Date of Patent: Nov. 21, 2017

(54) MAGNETIC CURRENT SENSOR CALIBRATION SYSTEM

(71) Applicant: HONEYWELL INTERNATIONAL INC., Morris Plains, NJ (US)

(72) Inventors: Andy Peczalski, Edina, MN (US); Tom Rezachek, Cottage Grove, MN (US)

(73) Assignee: Honeywell International Inc., Morris Plains, NJ (US)

( * ) Notice: Subject to any disclaimer, the term of this patent is extended or adjusted under 35 U.S.C. 154(b) by 96 days.

(21) Appl. No.: 14/883,225

(22) Filed: Oct. 14, 2015

(65) Prior Publication Data

US 2016/0109550 A1    Apr. 21, 2016

Related U.S. Application Data

(60) Provisional application No. 62/064,054, filed on Oct. 15, 2014.

(51) Int. Cl.
   *G01R 35/00* (2006.01)
   *G01R 15/20* (2006.01)

(52) U.S. Cl.
   CPC ......... *G01R 35/005* (2013.01); *G01R 15/205* (2013.01)

(58) Field of Classification Search
   CPC ............... G01R 35/005; G01R 15/205; G01R 33/0017; G01R 33/0035; G01R 33/06; G01R 15/20; G01R 33/0005
   USPC ................... 324/244–252, 116–126
   See application file for complete search history.

(56) References Cited

U.S. PATENT DOCUMENTS

| | | | |
|---|---|---|---|
| 2009/0091344 A1 | 4/2009 | Ausserlechner | |
| 2010/0211347 A1* | 8/2010 | Friedrich | G01R 33/0023 702/117 |
| 2011/0227560 A1* | 9/2011 | Haratani | B82Y 25/00 324/117 R |
| 2013/0207646 A1 | 8/2013 | Kong | |
| 2014/0333301 A1* | 11/2014 | Racz | G01R 19/0092 324/251 |
| 2015/0236493 A1 | 8/2015 | Peczalski | |

FOREIGN PATENT DOCUMENTS

| | | |
|---|---|---|
| EP | 0544479 A2 | 11/1991 |
| EP | 2908143 A1 | 8/2015 |
| GB | 2538905 A | 11/2016 |

(Continued)

OTHER PUBLICATIONS

U.K. Application No. GB1519075.4, U.K Search Report, dated Apr. 5, 2016, 4 pages.

(Continued)

*Primary Examiner* — Jay Patidar
(74) *Attorney, Agent, or Firm* — Conley Rose, P.C.

(57) ABSTRACT

A magnetic current sensor calibration system includes a plurality of sensors and a substrate. The substrate has a first surface and a second surface, and the sensors are mounted on the first surface. The substrate includes a bipolar calibration conductor and a unipolar calibration conductor. The bipolar calibration conductor is spaced apart from the plurality of sensors and is disposed between the first and second surfaces. The unipolar calibration conductor is spaced apart from the plurality of sensors and the bipolar calibration conductor, and is disposed between the first and second surfaces.

19 Claims, 4 Drawing Sheets

(56) References Cited

FOREIGN PATENT DOCUMENTS

| GB | 2533296 B | 4/2017 |
|---|---|---|
| WO | 2015030871 A1 | 3/2015 |
| WO | 2015030872 A1 | 3/2015 |

OTHER PUBLICATIONS

U.K. Application No. GB1519075.4, U.K Examination Report, dated Sep. 27, 2016, 2 pages.
U.K. Application No. GB1519075.4, U.K Intention to Grant, dated Feb. 6, 2017, 2 pages.
U.K. Application No. GB1519075.4, U.K Notification of Grant, dated Mar. 21, 2017, 2 pages.
U.K. Application No. GB1615284.5, U.K Search and Examination Report, dated Sep. 27, 2016, 7 pages.
U.K. Application No. GB1615284.5, U.K Examination Report, dated Feb. 7, 2017, 2 pages.
U.K. Application No. GB1615284.5, U.K Examination Report, dated Jun. 29, 2017, 4 pages.

\* cited by examiner

MAGNETIC CURRENT SENSOR CALIBRATION SYSTEM

CROSS-REFERENCE TO RELATED APPLICATIONS

This application claims the benefit of U.S. Provisional Application No. 62/064,054 filed Oct. 15, 2014.

TECHNICAL FIELD

The present invention generally relates to current sensors, and more particularly relates to systems and methods for calibrating magnetic current sensors.

BACKGROUND

Current sensors are used in myriad systems to monitor the magnitude of electrical current being supplied to or drawn by various electrical loads. Numerous techniques have been developed for sensing electrical current. One particular technique, which is used to measure relatively large current magnitudes, involves measuring the magnetic field that is generated when electrical current flows in a conductor.

Regardless of the technique that is employed, many current sensors that are used to measure relatively large current magnitudes operate in challenging environments. For example, these current sensors may be exposed to relatively large temperature variations, relatively high and/or low temperatures, and to vibration. It is desirable, in most instances, that these current sensors exhibit robust performance, such as very low offset and stable gain, in these challenging environments. It is additionally desirable that these current sensors provide health monitoring capability, and are further configured to issue an alert in the unlikely event of a malfunction. Unfortunately, many relatively high-accuracy, robust current sensors can be costly, and many rely on relatively cumbersome calibration procedures.

Hence, there is a need for a robust, accurate current sensor that can sense relatively large current magnitudes, provides health monitoring capability, and does not rely on a cumbersome calibration procedure. The present invention addresses at least these needs.

BRIEF SUMMARY

This summary is provided to describe select concepts in a simplified form that are further described in the Detailed Description. This summary is not intended to identify key or essential features of the claimed subject matter, nor is it intended to be used as an aid in determining the scope of the claimed subject matter.

In one embodiment, a magnetic current sensor calibration system includes a plurality of sensors and a substrate. The substrate has a first surface and a second surface, and the sensors are mounted on the first surface. The substrate includes a bipolar calibration conductor and a unipolar calibration conductor. The bipolar calibration conductor is spaced apart from the plurality of sensors and is disposed between the first and second surfaces. The unipolar calibration conductor is spaced apart from the bipolar calibration conductor, and is disposed between the first and second surfaces.

In another embodiment, a magnetic current sensor calibration system includes a plurality of sensors, a substrate, and a controller. The substrate has a first surface and a second surface, and the sensors are mounted on the first surface. The substrate includes a bipolar calibration conductor and a unipolar calibration conductor. The bipolar calibration conductor is spaced apart from the plurality of sensors and is disposed between the first and second surfaces. The unipolar calibration conductor is spaced apart from the bipolar calibration conductor, and is disposed between the first and second surfaces. The controller is electrically coupled to the bipolar calibration conductor, to the unipolar calibration conductor, and to the plurality of sensors. The controller is configured to energize the bipolar calibration conductor and the unipolar calibration conductor, adjust a gain and an offset of each of the plurality of sensors, and measure outputs of each of the plurality of sensors and differential outputs of sensor pairs.

In yet another embodiment, a magnetic current sensor calibration system includes a plurality of sensors, a substrate, a first bipolar calibration current output conductor, a second bipolar calibration current output conductor, a bipolar calibration current input conductor, a unipolar calibration current output conductor, and a unipolar calibration current input conductor. The substrate has a first surface and a second surface, and the sensors are mounted on the first surface. The substrate includes a bipolar calibration conductor and a unipolar calibration conductor. The first bipolar calibration current output conductor is electrically connected to the bipolar calibration conductor. The second bipolar calibration current output conductor is spaced apart from the first bipolar calibration current output conductor and is electrically connected to the bipolar calibration conductor. The bipolar calibration current input conductor is electrically connected to the bipolar calibration conductor and is disposed between, and is spaced equidistant from, the first and second bipolar calibration current input conductors. The unipolar calibration current output conductor is electrically connected to the unipolar calibration conductor. The unipolar calibration current input conductor is electrically connected to the unipolar calibration conductor and is spaced apart from the unipolar calibration current input conductor. The bipolar calibration conductor is spaced apart from the plurality of sensors and is disposed between the first and second surfaces. The unipolar calibration conductor is spaced apart from the plurality of sensors and the bipolar calibration conductor, and is disposed between the first and second surfaces. The bipolar calibration conductor is configured such that, upon being electrically energized, a first half of the sensors are exposed to a first magnetic field, and a second half of the sensors are exposed to a second magnetic field, the first magnetic field having a first magnitude and a first direction, the second magnetic field having the first magnitude and a second direction, the second direction opposite the first direction. The unipolar calibration conductor is configured such that, upon being electrically energized, all of the sensors are exposed to a third magnetic field having a third magnitude and one of the first direction or the second direction.

Furthermore, other desirable features and characteristics of the magnetic current sensor calibration system will become apparent from the subsequent detailed description and the appended claims, taken in conjunction with the accompanying drawings and the preceding background.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

Figure 1:
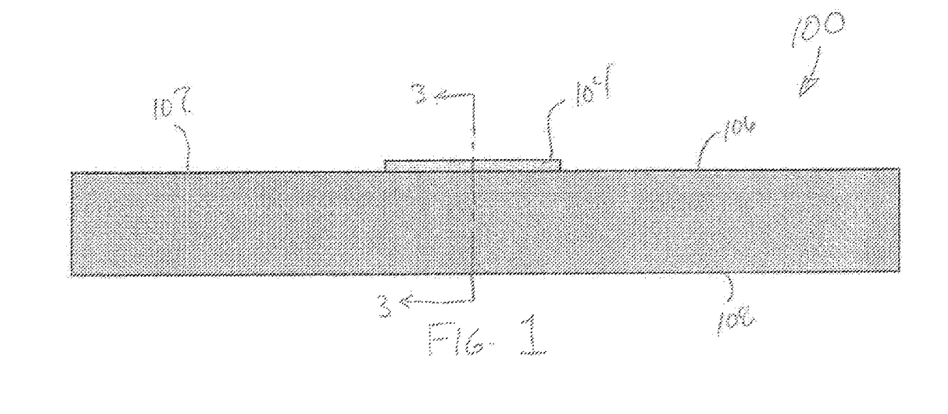
FIGS. 1-3 depicts side, top, and cross section schematic views, respectively, of one embodiment of a current sensor system.
Figure 2:
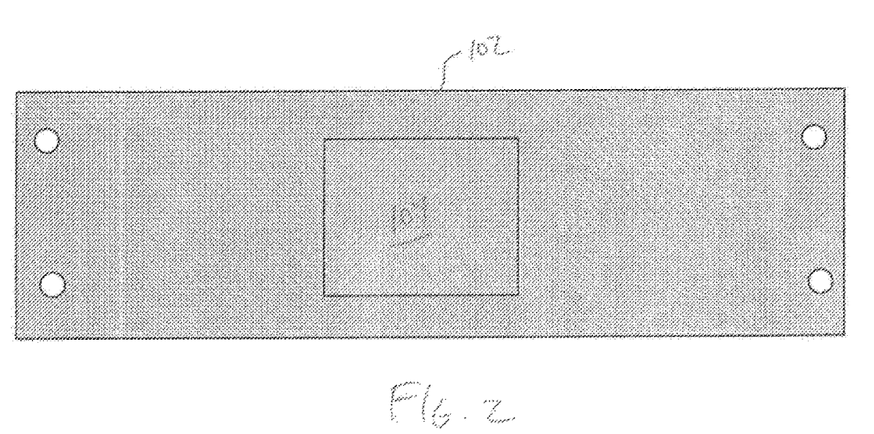
Figure 3:
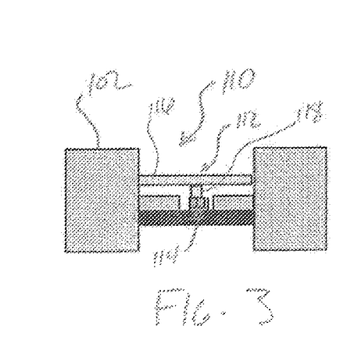

Referring now to FIGS. 1-3, side, top, and cross section schematic views, respectively, of a current sensor system 100 are depicted. The depicted system includes a conductor 102 and a current sensor 104. The conductor 102, which may be, for example, a bus bar made of copper, aluminum, or any one of numerous other electrical conductors, is configured to carry relatively high electrical currents. The conductor 102 has a top surface 106, a bottom surface 108, and an opening 110 formed therein that extends between the top and bottom surfaces 106, 108. Preferably, the opening 110 is disposed substantially in the middle of the width of the conductor 102.

The current sensor 104 is disposed within the opening 110 and includes a mount 112 and a plurality of sensors 114. The mount 112 may be variously configured and implemented, but in the depicted embodiment includes at least a conductor mount portion 116 and a sensor mount portion 118. The conductor mount portion 116, which may be variously configured, is used to secure the current sensor 104 within the opening 110. The sensor mount portion 118, which extends perpendicularly from the conductor mount portion 116, has the plurality of sensors 114 mounted thereon. Preferably, the sensors 114 are mounted on the sensor mount portion 118 such that the sensors 114 are disposed substantially halfway between the top and bottom surfaces 106, 108 of the conductor 102, and substantially in the middle of the opening 110. The sensors 114 are preferably implemented using magnetic sensors, such as anisotropic magneto-resistive (AMR) sensors, and thus sense the magnetic field that is generated when current flows in the conductor 102. Preferably, the magnetic field at the center of the opening, where the sensors 114 are disposed, is sufficiently small, even when relatively large current is flowing in the conductor 102. This allows very sensitive magnetic-field sensors 114 to be used.

Figure 4:
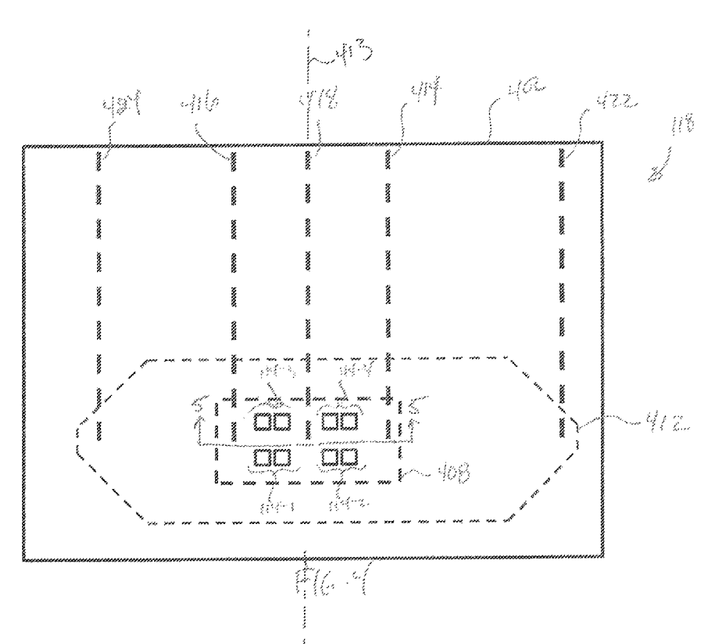
FIGS. 4-7 depict various simplified representations of a portion of a sensor mount portion that may be used to implement the system of FIG. 1.
Figure 5:
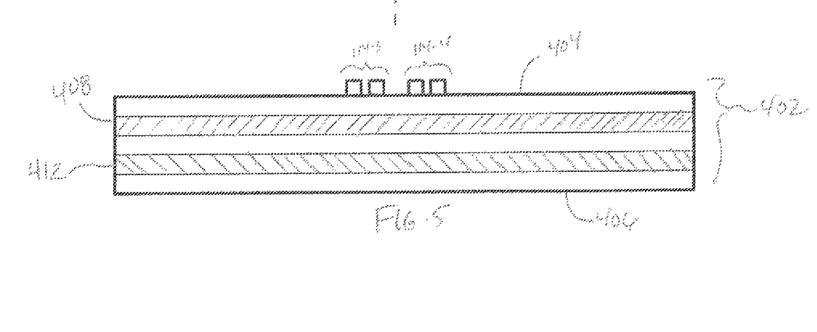

Turning now to FIGS. 4 and 5, more detailed, but simplified representations of a portion of the sensor mount portion 118 are depicted. The sensor mount portion 118 is preferably formed of a multilayer substrate 402, such as a multilayer circuit board. The substrate 402 includes a first surface 404, a second surface 406, a bipolar calibration conductor 408, and a unipolar calibration conductor 412. In the depicted embodiment, there are four independent sensors 114, all of which are mounted on the first surface 404. It will be appreciated that more or less than this number of sensors 114 could be used; however, the number of sensors 114 is preferably an even number. This is because a first half of the sensors 114 (e.g., 114-1, 114-3) are mounted on one side of an axis of symmetry 413 of the bipolar and unipolar calibration conductors 408, 412, and a second half of the sensors 114 (e.g., 114-2, 114-4) are mounted on the other side of the axis of symmetry 413.

The bipolar calibration conductor 408 is spaced apart from the plurality of sensors 114 and is disposed between the first and second surfaces 404, 406 of the substrate 402. The unipolar calibration conductor 412 is spaced apart from the bipolar calibration conductor 408, also between the first and second surfaces 404, 406 of the substrate 402. Although the bipolar calibration conductor 408 is depicted as being disposed closer to the first surface 404 than to the second surface 406, and the unipolar calibration conductor 412 is depicted as being disposed closer to the second surface 406 than to the first surface 404, this is merely an example of one embodiment. Indeed, in other embodiments, the locations of the bipolar calibration conductor 408 and the unipolar calibration conductor 412 could be switched.

Figure 6:
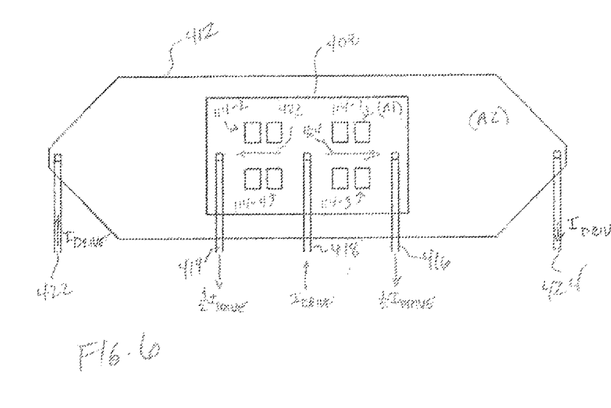
Figure 7:
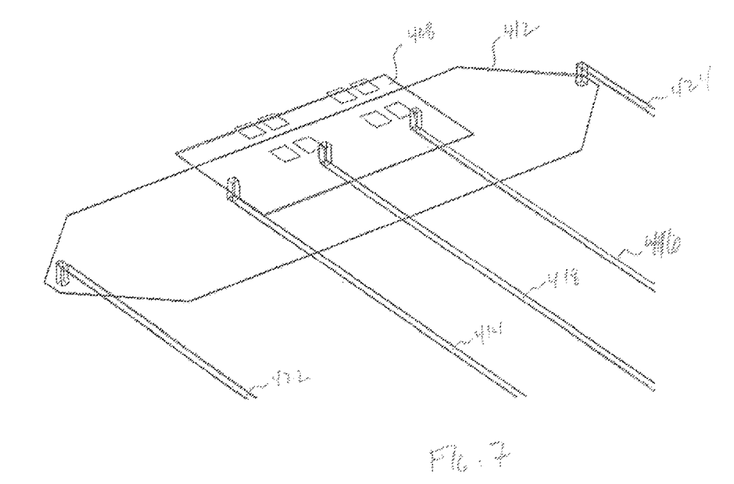

As FIGS. 4, 6, and 7 also depict, the calibration conductors 408, 412 have different sizes. In the depicted embodiment, the bipolar calibration conductor 408 has a first area (A1), and the unipolar calibration conductor 412 has a second area (A2) that is larger than the first area. It will be appreciated, however, that this too is merely an example of one embodiment, and in other embodiments the areas (A1, A2) could be equal, or the first area (A1) could be larger than the second area (A2).

As FIGS. 4-7 also depict, the sensor mount portion 118 additionally includes a plurality of calibration current conductors, each of which is formed in the substrate 402. These conductors include a first bipolar calibration current output conductor 414, a second bipolar calibration current output conductor 416, a bipolar calibration current input conductor 418, a unipolar calibration current input conductor 422, and a unipolar calibration current output conductor 424. The first and second bipolar calibration current output conductors 414, 416, and the bipolar calibration current input conductor 418 are all electrically connected to the bipolar calibration conductor 408. The first and second bipolar calibration current output conductors 414, 416 are spaced apart from each other, and the bipolar calibration current input conductor 418 is disposed between, and is spaced equidistant from, the first and second bipolar calibration current input conductors 414, 416. The bipolar calibration current input conductor 418 is also preferably aligned with the axis of symmetry 413.

As may be readily appreciated, when the bipolar calibration current input conductor 418 is supplied with a drive current ($I_{DRIVE}$), half of the drive current (½ $I_{DRIVE}$) will flow through the bipolar calibration conductor 408 in a first direction 422, and flow out the first bipolar calibration current output conductor 414, thereby generating a first magnetic field. The other half of the drive current (½ $I_{DRIVE}$) will flow through the bipolar calibration conductor 408 in a second direction 424, and flow out the second bipolar calibration current output conductor 416, thereby generating a second magnetic field. As a result, the first half of the sensors 114 (114-1, 114-3) will be exposed to the first magnetic field, and the second half of the sensors 114 (114-2, 114-4) will be exposed to the second magnetic field. Because the currents are equal but flowing in opposite directions, the first and second magnetic fields will have equal magnitudes, but opposite directions. That is, the first magnetic field will have a first magnitude and a first direction, while the second magnetic field will also have the first magnitude but will have a second direction that is opposite the first direction.

It will be appreciated that in some embodiments, the first and second bipolar calibration current output conductors 414, 416 could be first and second bipolar calibration current input conductors, and the bipolar calibration current input conductor 418 could instead be a bipolar calibration current output conductor. In these embodiments, when the first and second bipolar calibration current output conductors 414, 416 are supplied with a drive current ($I_{DRIVE}$), half of the drive current (½ $I_{DRIVE}$) will flow through the bipolar calibration conductor 408 in the first and second directions 422, 424 toward and out bipolar calibration current input conductor 418, thereby generating first and second magnetic fields.

The unipolar calibration current input and output conductors 422, 424 are spaced apart from each other and are electrically connected to the unipolar calibration conductor 412. These conductors 422, 424 are disposed such that when the unipolar calibration current input conductor 422 is supplied with a drive current ($I_{DRIVE}$), all of the current flows through the unipolar calibration conductor 412 in the same direction, and flow out the unipolar calibration current output conductor 424, thereby generating a magnetic field. Because of the configuration and disposition of the unipolar calibration current input and output conductors 422, 424, the relatively wide size of the unipolar calibration conductor 412, and the relative locations of the sensors 114, all of the sensors 114 will be exposed to the same magnetic field that is generated.

The unipolar calibration conductor 412 and the bipolar calibration conductor 408 are used to calibrate the current sensor 104, and may be used, after calibration and during operation, to monitor the health of the current sensor 104. The manner in which the calibration is carried out will now be described. In doing so, reference should be made to FIG. 8, which depicts a block diagram of a circuit that may be used to implement a particular calibration process.

Figure 8:
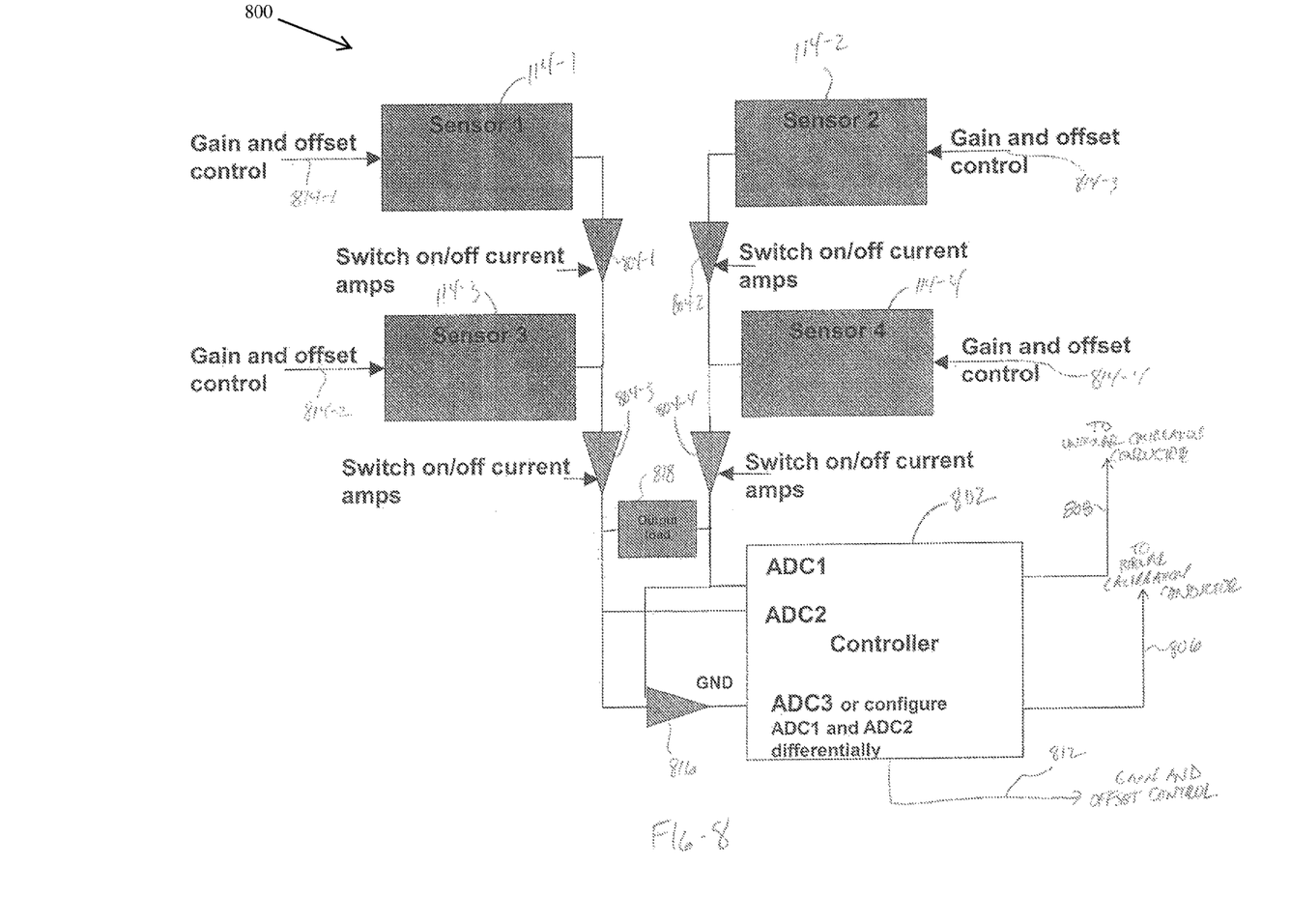
FIG. 8 depicts a block diagram of an exemplary embodiment of a circuit that may be used to calibrate the current sensor system of FIG. 1.

The calibration circuit 800 includes a controller 802 that is electrically coupled to the current sensor 104 and is configured to selectively energize the unipolar calibration conductor 412 and the bipolar calibration conductor 408. The controller 802 is also coupled to selectively receive the responses supplied from the sensors 114. The controller 802 selectively receives the responses by controlling current amplifiers 804 that are connected to a different one of the sensors 114. Specifically, the controller 802 is configured to selectively switch the amplifiers 804 on and off, as needed or desired. The controller 802 is also configured to control the currents applied to the calibration conductors 408, 412 via control lines 806 and 808, respectively, and to adjust the gain and offsets of the individual sensors 114 via control lines 812 (e.g., I2C or SPI) that are connected to individual sensor gain and offset control inputs 814 (e.g., 814-1, 814-2, 814-3, 814-4).

The controller 802 selectively energizes the calibration conductors 408, 412, and selectively obtains the responses from various ones of the sensors 114. The sensors 114 are then adjusted, based on the obtained responses, to appropriately calibrate the current sensor 104. More specifically, and as will now be described, the unipolar calibration conductor 412 is used to equalize the sensor gains and remove any offset, and the bipolar calibration conductor 408 is used to conduct sensor health checks and drift correction.

Initially, the controller 802 will energize the unipolar calibration conductor 412 to zero the offsets for the sensors 114. To do so, the controller 802 will energize the unipolar calibration conductor 412 with a first current magnitude. The controller 802 will then switch on consecutively the first, second, third, and fourth current amplifiers 804-1, 804-2, 804-3, and 804-4, and switch off the other amplifiers and obtain the response. The controller 802 will then repeat this using another current magnitude. The offset may be calculated from a linear extrapolation of the sensor output at the two current magnitudes. The offsets for the sensors 114 may then be adjusted via, for example, a digital potentiometer until the calibrations described above yield substantially zero offsets. It will be appreciated that in some embodiments, the current amplifiers 804 could be implemented using switches. In still other embodiments, this functionality could be implemented in the controller 802.

After the offsets are zeroed out, the gains of the sensors 114 are equalized. Specifically, the controller 802 energizes the unipolar calibration conductor 412 with a current magnitude, while switching on the first and second amplifier 804-1, 804-2, and switching off the third and fourth current amplifiers 804-3, 804-4. The gains of the first and second sensors 114-1, 114-2 are then equalized until the difference between their outputs is substantially equal to zero. This difference may be measured using differential amplifier 816. Thereafter, with the unipolar calibration conductor 412 still being energized with the same current magnitude, the third and fourth current amplifiers 804-3, 804-4 are switched on, and the first and second current amplifiers 804-1, 804-2 are switched off. The gains of the third and fourth sensors 114-3, 114-4 are then equalized.

Before proceeding further, it is noted that the sensor gains are equalized so that the sensors 114 will better reject common mode magnetic interference. Such magnetic interference could come from other nearby current conductors or from the earth magnetic field that may get amplified by nearby ferromagnetic materials, such as iron.

Returning now to the calibration process, after the sensor offsets are zeroed and the gains are equalized, the current sensor 104 gain is trimmed by placing it in the opening 110 in the conductor 102 (see FIG. 1), and passing a relatively high current, such as 50 amps, through the conductor 102. While the current is passing through the conductor 102, the gains of the first and second sensors 114-1, 114-2 are iteratively adjusted, preferably the same amount to maintain equalization, until the current sensor 104 outputs the correct value (e.g., 50 amps). Thereafter, the gains of the third and fourth sensors 114-3, 114-4 are iteratively adjusted, preferably the same amount, until the current sensor 104 outputs the correct value (e.g., 50 amps).

Finally, with the relatively high current (e.g., 50 amps) again passing through the conductor 102, the controller 802 supplies enough current to the bipolar calibration conductor 408 to bring the sensor 114 output to zero. In the depicted embodiment, the sensor output is the voltage drop across the output load 818, such as a resistor. This amount of current can then be used to perform sensor health checks and drift corrections by applying the calibration current determined above to the bipolar calibration conductor 408 preferably during a startup of the sensor 114 when there is no current flowing in the conductor 102. If the sensor output has not changed from the calibrated value, the sensor 114 is deemed to be functioning properly and there is no drift. It will be appreciated that sensor drift could also be corrected by performing the full calibration process described above to check if the sensor gains are equalized and the offsets are equal to zero. The gains and offsets could then be returned to the optimal values by the digital potentiometers to preserve the high performance of the sensor 114.

The current sensor system disclosed herein is robust, accurate, can sense relatively large current magnitudes, provides health monitoring capability, and does not rely on a cumbersome calibration procedure. Moreover, the configuration of the bipolar calibration conductor 408 allows for periodic in-situ testing of the current sensor 104 to ensure proper sensor operation and may also detect, for example, sensor drift.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A magnetic current sensor calibration system, comprising:
a plurality of sensors;
a controller electrically coupled to, and configured to, adjust a gain and an offset of each of the plurality of sensors; and
a substrate having a first surface and a second surface, the plurality of sensors mounted on the first surface, the substrate comprising:
a bipolar calibration conductor spaced apart from the plurality of sensors and disposed between the first and second surfaces; and
a unipolar calibration conductor spaced apart from the plurality of sensors and the bipolar calibration conductor, the unipolar calibration conductor disposed between the first and second surfaces.

2. The system of claim 1, wherein:
the bipolar calibration conductor is configured such that, upon being electrically energized, a first half of the sensors are exposed to a first magnetic field, and a second half of the sensors are exposed to a second magnetic field, the first magnetic field having a first magnitude and a first direction, the second magnetic field having the first magnitude and a second direction, the second direction opposite the first direction; and
the unipolar calibration conductor is configured such that, upon being electrically energized, all of the sensors are exposed to a third magnetic field having a third magnitude and one of the first direction or the second direction.

3. The system of claim 2, further comprising:
a first bipolar calibration current output conductor electrically connected to the bipolar calibration conductor;
a second bipolar calibration current output conductor spaced apart from the first bipolar calibration current output conductor and electrically connected to the bipolar calibration conductor; and
a bipolar calibration current input conductor electrically connected to the bipolar calibration conductor, the bipolar calibration current input conductor disposed between, and spaced equidistant from, the first and second bipolar calibration current output conductors.

4. The system of claim 2, further comprising:
a first bipolar calibration current input conductor electrically connected to the bipolar calibration conductor;
a second bipolar calibration current input conductor spaced apart from the first bipolar calibration current input conductor and electrically connected to the bipolar calibration conductor; and
a bipolar calibration current output conductor electrically connected to the bipolar calibration conductor, the bipolar calibration current output conductor disposed between, and spaced equidistant from, the first and second bipolar calibration current input conductors.

5. The system of claim 2, further comprising:
a unipolar calibration current output conductor electrically connected to the unipolar calibration conductor; and
a unipolar calibration current input conductor electrically connected to the unipolar calibration conductor and spaced apart from the unipolar calibration current input conductor.

6. The system of claim 1, further comprising:
a controller electrically coupled to the bipolar calibration conductor and to the unipolar calibration conductor, the controller configured to selectively energize the bipolar calibration conductor and the unipolar calibration conductor.

7. The system of claim 1, wherein:
the controller is further configured to measure outputs of each of the plurality of sensors and differential outputs of sensor pairs.

8. The system of claim 1, wherein:
the bipolar calibration conductor has a first area;
the unipolar calibration conductor has a second area; and
the first area and the second area are unequal.

9. The system of claim 8, wherein the second area is greater than the first area.

10. A magnetic current sensor calibration system, comprising:
a plurality of sensors;
a substrate having a first surface and a second surface, the plurality of sensors mounted on the first surface, the substrate comprising:
a bipolar calibration conductor spaced apart from the plurality of sensors and disposed between the first and second surfaces; and
a unipolar calibration conductor spaced apart from the plurality of sensors and the bipolar calibration conductor, the unipolar calibration conductor disposed between the first and second surfaces;

and
a controller electrically coupled to the bipolar calibration conductor, to the unipolar calibration conductor, and to the plurality of sensors, the controller configured to:
energize the bipolar calibration conductor and the unipolar calibration conductor;
adjust a gain and an offset of each of the plurality of sensors; and
measure outputs of each of the plurality of sensors and differential outputs of sensor pairs.

11. The system of claim 10, wherein:
the bipolar calibration conductor is configured such that, upon being electrically energized, a first half of the sensors are exposed to a first magnetic field, and a second half of the sensors are exposed to a second magnetic field, the first magnetic field having a first magnitude and a first direction, the second magnetic field having the first magnitude and a second direction, the second direction opposite the first direction; and
the unipolar calibration conductor is configured such that, upon being electrically energized, all of the sensors are exposed to a third magnetic field having a third magnitude and one of the first direction or the second direction.

12. The system of claim 11, further comprising:
a first bipolar calibration current output conductor electrically connected to the bipolar calibration conductor,
a second bipolar calibration current output conductor spaced apart from the first bipolar calibration current output conductor and electrically connected to the bipolar calibration conductor; and
a bipolar calibration current input conductor electrically connected to the bipolar calibration conductor, the bipolar calibration current input conductor disposed between, and spaced equidistant from, the first and second bipolar calibration current output conductors.

13. The system of claim 11, further comprising:
a first bipolar calibration current output conductor electrically connected to the bipolar calibration conductor;
a second bipolar calibration current output conductor spaced apart from the first bipolar calibration current output conductor and electrically connected to the bipolar calibration conductor; and
a bipolar calibration current input conductor electrically connected to the bipolar calibration conductor, the bipolar calibration current input conductor disposed between, and spaced equidistant from, the first and second bipolar calibration current output conductors.

14. The system of claim 11, further comprising:
a unipolar calibration current output conductor electrically connected to the unipolar calibration conductor; and
a unipolar calibration current input conductor electrically connected to the unipolar calibration conductor and spaced apart from the unipolar calibration current input conductor.

15. The system of claim 10, wherein:
the bipolar calibration conductor has a first area;
the unipolar calibration conductor has a second area; and
the first area and the second area are unequal.

16. The system of claim 15, wherein the second area is greater than the first area.

17. A magnetic current sensor calibration system, comprising:
a plurality of sensors;
a substrate having a first surface and a second surface, the plurality of sensors mounted on the first surface, the substrate comprising a bipolar calibration conductor and a unipolar calibration conductor;
a first bipolar calibration current output conductor electrically connected to the bipolar calibration conductor;
a second bipolar calibration current output conductor spaced apart from the first bipolar calibration current output conductor and electrically connected to the bipolar calibration conductor;
a bipolar calibration current input conductor electrically connected to the bipolar calibration conductor, the bipolar calibration current input conductor disposed between, and spaced equidistant from, the first and second bipolar calibration current output conductors;
a unipolar calibration current output conductor electrically connected to the unipolar calibration conductor; and
a unipolar calibration current input conductor electrically connected to the unipolar calibration conductor and spaced apart from the unipolar calibration current input conductor,
wherein:
the bipolar calibration conductor is spaced apart from the plurality of sensors and is disposed between the first and second surfaces,
the unipolar calibration conductor is spaced apart from the bipolar calibration conductor and the plurality of sensors and is disposed between the first and second surfaces,
the bipolar calibration conductor is configured such that, upon being electrically energized, a first half of the sensors are exposed to a first magnetic field, and a second half of the sensors are exposed to a second magnetic field, the first magnetic field having a first magnitude and a first direction, the second magnetic field having the first magnitude and a second direction, the second direction opposite the first direction, and
the unipolar calibration conductor is configured such that, upon being electrically energized, all of the sensors are exposed to a third magnetic field having a third magnitude and one of the first direction or the second direction.

18. The system of claim 17, further comprising:
a controller electrically coupled to the bipolar calibration conductor, to the unipolar calibration conductor, and to the plurality of sensors, the controller configured to:
energize the bipolar calibration conductor and the unipolar calibration conductor;
adjust a gain and an offset of each of the plurality of sensors; and
measure outputs of each of the plurality of sensors and differential outputs of sensor pairs.

19. The system of claim 17, wherein:
the bipolar calibration conductor has a first area;
the unipolar calibration conductor has a second area; and
the first area and the second area are unequal.

* * * * *